United States Patent [19]

Schlosser et al.

[11] Patent Number: 4,963,472
[45] Date of Patent: Oct. 16, 1990

[54] DEVELOPING METHOD FOR PRINTING PLATES FOR WATERLESS OFFSET PRINTING WITH GLYCOL DIETHER CONTAINING DEVELOPER

[75] Inventors: Hans-Joachim Schlosser, Wiesbaden; Joerg Strack, Mittelfischbach, both of Fed. Rep. of Germany

[73] Assignee: Hoechst Aktiengesellschaft, Frankfurt am Main, Fed. Rep. of Germany

[21] Appl. No.: 192,701

[22] Filed: May 11, 1988

[30] Foreign Application Priority Data

May 12, 1987 [DE] Fed. Rep. of Germany ....... 3715792

[51] Int. Cl.$^5$ .......................... G03F 7/021; G03F 7/32
[52] U.S. Cl. ..................................... 430/303; 430/162; 430/175; 430/309; 430/331
[58] Field of Search ............... 430/303, 162, 302, 331, 430/175, 309

[56] References Cited

U.S. PATENT DOCUMENTS

| | | | |
|---|---|---|---|
| 3,511,178 | 5/1970 | Curtin | 101/450 |
| 3,677,178 | 7/1972 | Gipe | 101/450 |
| 3,849,392 | 11/1974 | Steppan | 260/141 |
| 3,867,147 | 2/1975 | Teuscher | 96/33 |
| 3,894,873 | 7/1975 | Kobayashi et al. | 96/33 |
| 4,378,423 | 3/1983 | Suezawa et al. | 430/303 |
| 4,416,976 | 11/1984 | Schell | 430/302 |
| 4,642,283 | 2/1987 | Takahashi et al. | 430/303 |
| 4,775,607 | 10/1988 | Schlosser | 430/162 |
| 4,853,313 | 8/1989 | Mori et al. | 430/303 |

OTHER PUBLICATIONS

English Abstract of West Germany Pat. No. 3,543,961, published 6/1986.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A developing method for printing plates employing waterless offset processes is disclosed. The plates comprise a support coated with a photosensitive layer based on a diazonium salt polycondensation product and a super-imposed ink-repellent, crosslinked silicone elastomer layer, whereby said developer is characterized in that it contains a predominant proportion of compounds of the general formula $R-(O-CH_2-CH_2-)_n-O-R$, where R denotes $C_mH_{2m+1}$, n denotes an integer from 1 to 25 and m denotes an integer from 1 to 5. The present invention is particularly suitable for developing printing plates where the photosensitive layer comprises a diazonium salt polycondensation product comprising recurrent $A-N_2X$ and B units which are mutually linked by bridge members, especially methylene groups, which are derived from carbonyl compounds capable of condensation, A being the radical of an aromatic diazonium compound capable of condensation with formaldehyde, and B being the radical of a compound which is free of diazonium groups and is capable of condensation with formaldehyde, particularly of an aromatic amine, a phenol, a phenol ether, an aromatic thioether, an aromatic hydrocarbon, an aromatic heterocyclic compound or an organic acid amide.

12 Claims, No Drawings

DEVELOPING METHOD FOR PRINTING PLATES FOR WATERLESS OFFSET PRINTING WITH GLYCOL DIETHER CONTAINING DEVELOPER

BACKGROUND OF THE INVENTION

The present invention relates to a developing method for developing positive-working offset plates employing waterless offset processes. In particular, the developing method is suited for photosensitive printing plates which are composed of a layer support, a photosensitive layer containing a diazonium salt polycondensation product, and an overlying ink-repellent crosslinked silicone elastomer layer, wherein the diazonium salt polycondensation product comprises recurrent A-N2X and B units which are mutually linked by bridge members, especially methylene groups, which are derived from carbonyl compounds capable of condensation, A being the radical of an aromatic diazonium compound capable of condensation with formaldehyde, and B being the radical of a compound which is free of diazonium groups and is capable of condensation with formaldehyde, particularly of an aromatic amine, a phenol, a phenol ether, an aromatic thioether, an aromatic hydrocarbon, an aromatic heterocyclic compound or an organic acid amide.

Plates of this type have been disclosed by U. S. Application Serial No. 943,034, filed Dec. 17, 1986, equivalent to prior, not pre-published German Patent Application No. P 35 45 204.8, wherein the photosensitive layer comprises diazonium salt condensation products according to U.S. Pat. No. 3,867,147 and U.S. Pat. No. 3,849,392, with a super-imposed layer of crosslinked silicone elastomer. The teaching of this Patent Application, hereinafter called A), is hereby incorporated by reference.

If these or similar types of printing plates are employed, the photosensitive layer is crosslinked in the exposed areas, which thereby are rendered insoluble in the developer. During development, the silicone elastomer and the photosensitive layer cannot be rubbed off. In the non-exposed areas, the photosensitive layer remains soluble, and during development the silicone elastomer and the photosensitive layer are rubbed off and the support or, respectively, the adhesion-promoting layer on the support is laid bare. When a plate treated in this way is inserted into a printing machine and inked, the ink adheres to the bare areas and is repelled by the silicone-covered areas. Printing can be performed without dampening solution.

With this type of printing plates, the developer must diffuse through the silicone elastomer layer and dissolve the underlying photosensitive layer in the non-exposed areas, and thus make possible the rubbing-off of the silicone rubber from these areas. Furthermore, the developer must cause the silicone elastomer to swell and be able to disperse the rubbed-off elastomer portions to prevent the formation of flakes. Only then can good resolution be achieved.

Developers for plates which are suitable for waterless printing are known, for example, from U.S. Pat. No. 3,677,178. This publication suggests to perform development with water, to which small amounts of wetting agents are added, such as Na-lauryl sulfonate, alkylphenyl ether, polyethylene glycol, trimethylolnonyl ether of propylene glycol and polyalkylglycol ether. With this developer composition it is, however, not possible to develop plates which, in particular, correspond to type A).

The developer for waterless offset processes which is described in German Auslegeschrift No. 16 71 637 (equivalent to U.S. Pat. No. 3,511,178) comprises a mixture of butyl acetate, propyl alcohol and water. Due to the different evaporation rates, mixtures of this type change very rapidly, and they also result in insufficient image resolution (see Comparative Example Cl). The butyrolactone also mentioned in this publication likewise results in an unsatisfactory development, in particular, if plates of type A) are employed (Comparative Example C2).

U.S. Pat. No. 3,894,873 suggests the use of paraffinic hydrocarbons, benzene, toluene, xylene, and the like for developers. The developers can additionally contain a preferred amount of less than 50% of halogenated hydrocarbons, alcohols, ketones, carboxylic acids or esters. However, they are intended for plates where the photosensitive layer comprises photopolymers that induce crosslinking with the adjoining surface of the silicone elastomer layer that must not be attacked in the unexposed state. Plates whose composition corresponds, for example, to type A) cannot be developed with pure isoparaffinic hydrocarbons. This is also due to the different principle of operation (Comparative Example C3).

European Patent Application No. 0,043,132 (equivalent to U.S. Pat. No. 4,378,423) also discloses a developer for photoadhesive layers, which must not attack the photosensitive layer. The developer comprises a predominant proportion of paraffinic hydrocarbons with an admixture of 2 to 20% of propylene glycol derivatives. It is also possible to add solvents, such as water, alcohols, esters, ethers, carboxylic acids, aromatic hydrocarbons and halogenated hydrocarbons, in quantities which do not attack the uncured photoadhesive layer. The developers prepared according to the teaching of this publication are inappropriate for development of plates of type A), because their mode of operation differs from that of A) (development and dissolution of the photosensitive layer) (see Comparative Example C4).

German Offenlegunsschrift No. 35 43 961 describes a developer for waterless offset printing plates, which comprises at least two organic solvents, a surfactant and at least 30% of water. This developer is suitable for plates which contain unsaturated monomers, photosensitive polymers, azido resins or zinc salt complexes of condensation products obtained from formaldehyde and a diazonium compound as photosensitive, photocurable layers. One of the solvents is intended to dissolve the photosensitive layer in the non-exposed areas and the other solvent causes swelling of the silicone elastomer. The following are mentioned as swelling solvents: alcohols, esters, ketones, ethers, aromatic hydrocarbons, halogenated hydrocarbons and carboxylic acids. The following are claimed as suitable second solvents: paraffinic hydrocarbons, cycloparaffinic hydrocarbons, aromatic hydrocarbons, aliphatic ketones, glycol ethers and alkyl esters of aliphatic carboxylic acids. If a developer according to the teaching of this publication, containing at least 30% of water, is used for developing layers of, for example, type A), the resolution in the reproduction of fine screen patterns is insufficient (Comparative Example C5).

SUMMARY OF THE INVENTION

It is therefore an object of the present invention to provide a developing method for printing plates employing waterless offset processes, which plates are comprised of a support coated with a photosensitive layer based on a diazonium salt polycondensation product and a super-imposed inkrepellent, crosslinked silicone elastomer layer, and in particular are plates of the type A) whereby said developer shall result in a good resolution within a short time, shall be miscible with water and have a sufficiently high flash point, so that it can be employed in a state-of-the-art development apparatus without any problems.

In accordance with these and other objects, there is provided a developing method for printing plate employing waterless offset processes, the plates comprising a support coated with a photosensitive layer based on a diazonium salt polycondensation product and a super-imposed inkrepellent, crosslinked silicone elastomer layer and the developer comprising compounds of the general formula $$R-(O-CH_2-CH_2-)_n-O-R$$

wherein
R denotes $C_mH_{2m+1}$,
n denotes an integer from 1 to 25, and
m denotes an integer from 1 to 5.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

Developers according to the present invention contain a predominant proportion of compounds of the general formula $$R-(O-CH_2-CH_2-)_n-O-R$$

wherein
R denotes $C_mH_{2m+1}$,
n denotes an integer from 1 to 25, and
m denotes an integer from 1 to 5.

Glycol diethers are preferably suitable as compounds of the above formula. Particular preference is, for example, given to diethylene glycol dimethyl ether (DDM), polyethylene glycol dimethyl ether (PDM), diethylene glycol dibutyl ether (DDB), diethylene glycol diethyl ether (DDE), and triethylene glycol dimethyl ether (TDM). These compounds are used alone or as mixtures.

To achieve better wetting of silicone elastomer and a better dispersion of the rubbed-off silicone the developer can contain various additives, such as, for example, surfactants, in an amount sufficient to wet the silicone elastomer, but not more than about 15% by weight. Anionic, cationic and non-ionic surfactants may be employed. Examples of suitable anionic surfactants include aliphatic acid salts, sulfosuccinamates, acylaminoalkane sulfonates, sarcosides, alkyl phosphates, alkyl ether phosphates, alkyl ether sulfates, alkylaryl ether phosphates, and alkyl ether carboxylates. Examples of suitable cationic surfactants include straight-chain alkylammonium compounds and cyclic alkyl-ammonium, pyridinium, quinolinium, pyrrolidinium and piperidinium compounds. Examples of suitable non-ionic surfactants include polyglycol ethers, alkyl polyglycol ethers, arylalkyl polyglycol ethers, acyl polyglycol ethers, acylamide polyglycol ethers, propylene oxide adducts of alkyl aminopolyglycol ethers, polyol esters, fatty acid alkanolamides, polyglycols and polypropylene glycols. Ampholytes and fluorine-containing surfactants can also be used.

Further possible additives include alcohols, preferably in amounts from about 5 to 40%, in particular glycols, and water which should, however, be added in amounts of less than about 20%, because otherwise the resolution is clearly deteriorated. Wetting of the silicone elastomer can also be improved by adding aliphatic and aromatic hydrocarbons. The amount of additives should not exceed the amount of compound 1. Development can be accelerated by the addition of, for example, N,N-dimethylformamide, dimethylsulfoxide, butyrolactone, N-methylpyrrolidone, N,N-methylacetamide and N-hexylpyrrolidone.

A non-limiting, detailed description of the instant invention is given by way of the examples summarized in the Table below. The following plates were employed for development:

Plate I 3 parts by weight (p.b.w.) of a condensation product obtained from 1 mol of 3-methoxy-diphenylamine-4-diazonium salt and 1 mol of 4,4,-bismethoxymethyldiphenyl ether, isolated as the mesitylene sulfonate, and 3 p.b.w. of a reaction product obtained from 50 p.b.w. of polyvinyl butyral and 4 p.b.w. of maleic acid anhydride were dissolved in 93.61 p.b.w. of 2-methoxyethanol. 0.3 p.b.w. of phthalocyanine, 0.02 p.b.w. of phenylazodiphenylene diamine and 0.07 p.b.w. of phosphoric acid were added to this solution. The solution was applied to an electrolytically grained and anodically oxidized aluminum plate. A layer weight of 1 g/m² was obtained.

84 p.b.w. of a 50% solution of the reaction product of 1.99 p.b.w. of a dimethylpolysiloxane having terminal OH groups (OH group content 3.5%) and 1 p.b.w. of 3-(2-amino-ethylamino)- propyltrimethoxy silane were added to a solution of 5 p.b.w. of a dimethylpolysiloxane possessing terminal OH groups bonded to silicon and having a Brabender plasticity of 5.8 kNm and 0.3 p.b.w. of a solution of a methylhydrogenpolysiloxane having terminal trimethylsiloxy groups and a viscosity of 0.4 cm²/s at 25° C., in 9.7 p.b.w. of toluene. 0.4 p.b.w. of a mixture of vinyltrimethoxysilane and 3-glycidyloxy-propyl-trimethoxysilane was added to this solution. The silicone elastomer mixture prepared in this way was applied on top of the photosensitive layer, such that a layer weight of 3.4 g/m² was obtained after drying at 100° C. for 3 minutes.

Plate II 3 p.b.w. of the diazonium salt and 3 p.b.w. of the binder described for Plate I were dissolved in 93.9 p.b.w. of 2-methoxy-ethanol. The solution was applied to an electrolytically grained and anodically oxidized aluminum plate. The layer weight was 1 g/m².

10 p.b.w. of a dimethylpolysiloxane having terminal vinyldimethylsiloxane units and a viscosity of 400 mPa.s at 25° C. were mixed with 0.025 p.b.w. of 2-methyl-3- butyn-2-ol, 0.3 p.b.w. of a mixture, described below, of a platinum complex of vinylsiloxane as a catalyst and a diluent, 0.09 p.b.w. of a copolymer of 4 mol% of trimethylsiloxane units, 72 mol% of methylhydrogensiloxane units and 24 mol% of dimethylsiloxane units, having a viscosity of 50 mPa.s at 25° C. and a Si-bonded hydrogen content of 1.36%, and 88.9 p.b.w. of (R)Isopar E. The silicone elastomer mixture prepared in this way was applied on top of the photosensitive layer, such that a layer weight of 3.4 g/m² was obtained after drying at 110° C. for 3 minutes.

The platinum complex mixture was prepared as follows: 20 p.b.w. of sodium bicarbonate were added to a mixture of 10 p.b.w. of $H_2PtCl_6 \times 6H_2O$, 20 p.b.w. of 1,3-divinyl-1,1,3,3-tetramethyldisiloxane and 50 p.b.w. of ethanol. The mixture was heated to boiling under reflux for 30 minutes with stirring, and left to stand for 15 hours and afterwards filtered. The volatile constituents were distilled off from the filtrate under 16 mbar. As the residue, 17 p.b.w. of a liquid were obtained, which was dissolved in benzene. The solution was filtered and the benzene was distilled off from the filtrate. The residue was mixed with a dimethylpolysiloxane diluent, having terminal vinyldimethylsiloxane units and a viscosity of 1.4 Pa.s at 23° C., in such a quantity that the mixture contained 1% by weight of the platinum, calculated as the element.

The Plates I and II were stored for at least 24 hours and then exposed for 70 seconds through an original using a 5 kW halide lamp. The exposed plates were treated for 6 minutes with the developer solutions specified in the Table below, employing an oscillating felt dabber (stroke 4.8 mm; oscillation frequency 3,000/min; exerted pressure 1,500 N/m²). Thereafter, the plates were rinsed with water, dried and inked with black printing ink. The resolution achieved was evaluated by means of an UGRA Offset Test Wedge 1982 in the positive and negative highlight areas (60 lines/cm).

TABLE

| Example No. | Solvents and ratios | Resolution Plate I | | Plate II | |
|---|---|---|---|---|---|
| C1 | Ethyl acetate: Propanol: water 2:5:1 | 50 | 98 | 50 | 98 |
| C2 | Butyrolactone | 20 | 96 | 5 | 95 |
| C3 | (R)Isopar (isoparaffinic hydrocarbons having a boiling range from 176 to 188° C. | no development | | | |
| C4 | (R)Isopar + tripropylene glycol | no development | | 10 | 99 |
| C5 | (R)Isopar G: benzyl alcohol: i-octanol: anionic surfactant (28% solution in water) 5.25:5.25:2.1:17.5 | 5 | 98 | 40 | 98 |
| 1 | Diethylene glycol dimethyl ether (DDM) | 2 | 97 | 3 | 98 |
| 2 | Polyethylene glycol dimethyl ether (PDM 250) | 2 | 97 | 4 | 98 |
| 3 | DDM: diethylene glycol dibutylether (DDB): tripropylene glycol 70:20:10 | 3 | 99 | 3 | 98 |
| 4 | DDM: diethylene glycol diethyl ether (DDE): PDM 250, 70:20:10 | 2 | 97 | 3 | 99 |
| 5 | Triethylene glycol dimethyl ether (TDM): DDE: PDM 250: N-methylpyrrolidone 63.6:18.2:9.1:9.1 | 2 | 98 | 2 | 97 |
| 6 | DDM: DDB: PDM 250: (R)Genamin 050 63.6:18.2:9.1:9.1 | 4 | 98 | 2 | 99 |
| 7 | DDM: (R)Isopar H 70:30 | 2 | 97 | 2 | 99 |

What is claimed is:

1. A method for producing waterless offset printing plates, comprising the steps of:
   coating a support with a photosensitive layer based on a diazonium salt polycondensation product;
   coating said photosensitive layer with a layer of silicone elastomer;
   crosslinking said silicone elastomer to produce an unexposed printing plate;
   imagewise exposing said unexposed printing plate to radiation; and
   developing said exposed plate in a developer consisting essentially of from 50 to 100% by weight of at least one compound of the general formula $$R - (O - CH_2 - CH_2 -)_n - O - R$$

wherein
R denotes $C_mH_{2m+1}$,
n denotes an integer from 1 to 25, and
M denotes an integer from 1 to 5.

2. A developing method as claimed in claim 1, additionally consisting essentially of at least one surfactant.

3. A developing method as claimed in claim 2, said developer consisting essentially of not more than 15% by weight of said surfactant.

4. A developing method as claimed in claim 1, additionally consisting essentially of at least one alcohol.

5. A developing method as claimed in claim 4, said developer consisting essentially of 5 to 40% by weight of said alcohol.

6. A developing method as claimed in claim 1, said developer additionally consisting essentially of not more than 20% by weight of water.

7. A developing method as claimed in claim 1, said developer additionally consisting essentially of at least one selected from the group consisting of N,N-dimethylacetamide, N-methylpyrrolidone, N-hexylpyrrolidone, N,N-dimethylformamide, dimethylsulfoxide, butyrolactone and aliphatic hydrocarbons.

8. A developing method as claimed in claim 7, said developer comprising not more than 50% by weight of said at least one compound selected from the group consisting of N,N-dimethylacetamide, N-methylpyrrolidone, N-hexylpyrrolidone, N,N-dimethylformamide, dimethylsulfoxide, butyrolactone and aliphatic hydrocarbons.

9. A developing method as claimed in claim 1, wherein said diazonium salt polycondensation product comprises recurrent $A-N_2X$ and B units that are mutually linked by bridge members that are derived from carbonyl compounds capable of condensation, A is the radical of an aromatic diazonium compound capable of condensation with formaldehyde, and B is the radical of a compound which is free of diazonium groups and is capable of condensation with formaldehyde.

10. A developing method as claimed in claim 9, wherein B consists of at least one member selected from the group consisting of an aromatic amine, a phenol, a phenol ether, an aromatic thioether, an aromatic hydrocarbon, an aromatic heterocyclic compound and anorganic acid amide.

11. A developing method as claim in claim 9, wherein said bridge members comprise methylene groups.

12. A developing method as claimed in claim 1, comprising a mixture of compounds corresponding to the general formula.

* * * * *